(12) United States Patent
Achiwa et al.

(10) Patent No.: US 7,581,320 B2
(45) Date of Patent: Sep. 1, 2009

(54) METHOD FOR CONNECTING COMPONENT DELIVERY TAPES, STRUCTURE OF THE CONNECTION, AND SCISSORS FOR COMPONENT DELIVERY TAPE, USED FOR THE CONNECTION METHOD

(75) Inventors: Norimitsu Achiwa, Chiryu (JP); Yukinori Takada, Chiryu (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 692 days.

(21) Appl. No.: 10/544,709

(22) PCT Filed: Feb. 10, 2004

(86) PCT No.: PCT/JP2004/001373

§ 371 (c)(1), (2), (4) Date: Aug. 5, 2005

(87) PCT Pub. No.: WO2004/071896

PCT Pub. Date: Aug. 26, 2004

(65) Prior Publication Data

US 2006/0213606 A1    Sep. 28, 2006

(30) Foreign Application Priority Data

Feb. 12, 2003    (JP)    ............................. 2003-034158

(51) Int. Cl.
*B26B 17/00* (2006.01)
*B26B 13/00* (2006.01)

(52) U.S. Cl. .............................. 30/131; 30/175; 30/179; 30/186; 30/231; 30/233; 156/304.1; 156/304.3; 156/502

(58) Field of Classification Search .............. 150/304.1, 150/304.3, 502; 30/131, 175, 179, 186, 231, 30/233, 254, 134, 194
See application file for complete search history.

(56) References Cited

U.S. PATENT DOCUMENTS

| 519,509 | A | * | 5/1894 | Steen | .......................... 30/233 |
| 1,031,873 | A | * | 7/1912 | Ritschard | ..................... 30/173 |
| 1,082,385 | A | * | 12/1913 | Zimmerman | ................. 30/233 |
| 1,251,101 | A | * | 12/1917 | Quigley | ....................... 30/233 |

(Continued)

FOREIGN PATENT DOCUMENTS

| JP | 013584/1980 | 1/1980 |
| JP | 072957/1987 | 5/1987 |
| JP | 071875/1988 | 5/1988 |
| JP | 5-259691 | 10/1993 |
| JP | 2001-277184 | 10/2001 |
| JP | 2004-91039 | 3/2004 |

*Primary Examiner*—Mark A Osele
(74) *Attorney, Agent, or Firm*—Oblon, Spivak, McClelland, Maier & Neustadt, P.C.

(57) ABSTRACT

Scissors for cutting off a part delivery tape are disclosed. The part delivery tape includes a carrier tape with recesses at predetermined intervals where the recesses include openings on an upper end for accommodating parts, and a top tape adhered to the upper surface of the carrier tape so as to cover the openings of the recess portions. The scissors include a blade member and an abutment member rotatably mounted on a pivot. The blade member includes first and second blades and a grip, the blades and grip at opposite sides of the pivot. The abutment member includes an abutting portion and a grip at opposite sides of the pivot. In the cutting position the first blade is arranged to have a clearance between the first blade and the abutting portion equal to the thickness of the top tape.

5 Claims, 7 Drawing Sheets

U.S. PATENT DOCUMENTS

| | | | |
|---|---|---|---|
| 2,187,655 A * | 1/1940 | Kann | 30/135 |
| 4,227,305 A * | 10/1980 | Newman | 30/229 |
| 6,073,334 A * | 6/2000 | Asai et al. | 29/513 |
| RE39,286 E * | 9/2006 | Silver et al. | 30/134 |
| 2002/0040761 A1 * | 4/2002 | Sumida et al. | 156/304.3 |

* cited by examiner

METHOD FOR CONNECTING COMPONENT DELIVERY TAPES, STRUCTURE OF THE CONNECTION, AND SCISSORS FOR COMPONENT DELIVERY TAPE, USED FOR THE CONNECTION METHOD

TECHNOLOGICAL FIELD

The present invention relates to a method of connecting part delivery tapes mounted on a part supply device that composes a part mounting apparatus, a structure of the connection, and scissors for part delivery tape, used for the connecting method.

BACKGROUND ART

A part supply device that composes a part mounting apparatus for mounting parts on a circuit board is loaded with part delivery tapes wound onto a reel and successively supplies parts from the part delivery tape. The part delivery tape is constituted of a long carrier tape in which recess portions for accommodating parts are formed at predetermined intervals and a long top tape that is adhered to the upper surface of the carrier tape so as to cover the opening of the recess portions. When the rest of the part delivery tape becomes a little amount, a new part delivery tape (a second part delivery tape) is connected to the part delivery tape (a first part delivery tape) to continue supplying the parts. A method of connecting part delivery tapes is disclosed, wherein the carrier tapes and the top tapes of the first and second part delivery tapes are respectively connected by connecting tapes (Patent Document 1). The trailing end of the first part delivery tape and the leading end of the second part delivery tape are cut off with a cutting off tool that is provided with a wavelike blade. Thereafter, the leading end and the trailing end are connected by the connecting tape with the both end surfaces thereof being in abutting contact with each other, in which the leading end is not laid on the trailing end.

Patent Document 1 is a Japanese unexamined, published patent application No. 2002-187210 (page 7 to 9, FIGS. 1, 4, 15 and 16).

In the above mentioned method, wherein the top tapes of the first and second part delivery tapes are connected with the connecting tape, there is a problem that the top tape of the second part delivery tape is not torn off successively from the carrier tape if the connecting tape is torn off from the top tape of the second part delivery tape, and thereby the top tape of the second part delivery tape is not well connected with the top tape of the first part delivery tape. The connecting tape is torn off from the top tape where the adhesive strength with which the connecting tape adheres to the top tape is less than the adhesive strength with which the top tape adheres to the carrier tape, or where the top tape becomes difficult to be torn off from the carrier tape because the top tape and the carrier tape are engaged with each other at the cut portion where the both tapes are laid on each other to be cut off.

Accordingly, it is a primary object of the present invention to resolve the above mentioned problem and to provide an improved method of connecting part delivery tapes, a structure of the connection, and scissors for part delivery tape, used for the connecting method, wherein the top tape of the second part delivery tape is well connected with the top tape of the first part delivery tape and is successively torn off from the carrier tape thereof.

DISCLOSURE OF THE INVENTION

In a method of connecting part delivery tapes according to the present invention, a leading end of a second top tape of a second part delivery tape is laid on an upper surface of a trailing end of a first top tape of a first part delivery tape, and a connecting tape is adhered over the laid-on portion so as to connect the first and second top tapes. The first part delivery tape is constituted of a first long carrier tape in which recess portions having respective openings on the upper ends thereof for accommodating parts are formed at predetermined intervals and the first long top tape that is adhered to the upper surface of the first carrier tape so as to cover the openings of the recess portions. The second part delivery tape is constituted of a second long carrier tape in which recess portions having respective openings on the upper ends thereof for accommodating parts are formed at predetermined intervals and a second long top tape that is adhered to the upper surface of the second carrier tape so as to cover the openings of the recess portions.

Thus, the leading end of the second top tape is laid on the upper surface of the trailing end of the first top tape, and the connecting tape is adhered over the laid-on portion, whereby the leading end of the second top tape is inserted between the trailing end of the first top tape and the connecting tape so as to connect both top tapes firmly. Accordingly, the first and second top tapes is so well connected that they can be torn off from the respective carrier tapes because the leading end of the second top tape is put up with the trailing end of the first top tape being put up when the first and second top tapes connected with the connecting tape are torn off from the carrier tapes.

In a method of connecting the part delivery tapes in the second invention, the second top tape and the second carrier tape are cut off so that the second top tape is extended for a predetermined length beyond the end of the second carrier tape. The extended end portion of the second top tape is laid on the upper surface of the first top tape whose end is even with the end of the first carrier tape, and a connecting tape is adhered over the laid-on portion so as to connect the first and second top tapes.

According to the second invention, the second carrier tape and the second top tape are cut off so that the second top tape is extended for a predetermined length beyond the end of the second carrier tape. The trailing end of the first top tape is even with the trailing end of the first carrier tape. The extended end portion of the second top tape is laid on the upper surface of the trailing end of the first top tape, and, a connecting tape is adhered over the laid-on portion so as to connect the first and second top tapes. The second top tape can be easily laid on the first top tape, wherein the respective end surfaces of the first and second carrier tapes are in abutting contact with each other and the end portions of the first and second carrier tapes are not laid on each other.

In a structure of connection between part delivery tapes according to the third invention, a leading end of a second top tape of a second part delivery tape is laid on an upper surface of a trailing end of a first top tape of a first part delivery tape, and a connecting tape is adhered over the laid-on portion so as to connect the first and second top tapes. The first part delivery tape is constituted of a first long carrier tape in which recess portions having respective openings on the upper ends thereof for accommodating parts are formed at predetermined intervals and a first long top tape that is adhered to the upper surface of the first carrier tape so as to cover the openings of the recess portions. The second part delivery tape is constituted of a second long carrier tape in which recess portions having respective openings on the upper ends thereof for accommodating parts are formed at predetermined intervals and a second long top tape that is adhered to the upper surface of the second carrier tape so as to cover the openings of the recess portions.

Thus, the leading end of the second top tape is laid on the upper surface of the trailing end of the first top tape, and the connecting tape is adhered over the laid-on portion, whereby the leading end of the second top tape is inserted between the trailing end of the first top tape and the connecting tape so as to connect both top tapes firmly. Accordingly, the first and second top tapes is so well connected that they can be torn off from the respective carrier tapes because the leading end of the second top tape is put up with the trailing end of the first top tape being put up when the first and second top tapes connected with the connecting tape are torn off from the carrier tapes.

Scissors for part delivery tape according to the fourth invention cut off a part delivery tape that is constituted of a long carrier tape in which recess portions having respective openings on the upper ends thereof for accommodating parts are formed at predetermined intervals and a long top tape that is adhered to the upper surface of the carrier tape so as to cover the openings of the recess portions. The scissors comprises a blade member and an abutment member, which are mounted on a pivot so as to be relatively rotatable. The blade member is provided with the first and second blades on one end portion thereof and a grip on another end portion at the opposite sides of the pivot. The abutment member is provided with an abutting portion on one end portion thereof and a grip on another end portion at the opposite sides of the pivot. The first and second blades extend in parallel with being a predetermined distance apart. Where the scissors are at the cutting posture, the clearance between the first blade and the opposite surface of the abutting portion is equal in thickness to the top tape, and the second blade is arranged to abut on the opposite surface of the abutting portion so as to cut off the part delivery tape that is inserted from the first blade side of the scissors.

In cutting off the part delivery tape with the scissors, the part delivery tape is inserted from the first blade side of the scissors, and the grips are moved close to each other to cut off the part delivery tape between the blades and the abutting portion. That is, the carrier tape of the part delivery tape is cut off between the first blade and the abutment portion, and at the same time the part delivery tape is cut off between the second blade and the abutting portion, whereby the part delivery tape can be made with ease, wherein the top tape extends for a length equal to the distance between the first and second blades beyond the end of the carrier tape.

In the scissors for part delivery tape in the fifth invention, the part delivery tape is inserted from the first blade side of the scissors to cut off the part delivery tape. Thereby, the part delivery tape can be reliably made, wherein the second top tape extends for a length equal to the distance between the first and second blades beyond the end of the second carrier tape.

Moreover, in the scissors for part delivery tape in the sixth invention, a support member is fixed on the side surface of the first blade so as to support the part delivery tape. Accordingly, the part delivery tape can be supported by the support member when the part delivery tape is cut off, whereby an operator can with ease cut off the part delivery tape.

Scissors for part delivery tape according to the seventh invention cut off a part delivery tape that is constituted of a long carrier tape in which recess portions having respective openings on the upper ends thereof for accommodating parts are formed at predetermined intervals and a long top tape that is adhered to the upper surface of the carrier tape so as to cover the openings of the recess portions. The scissors comprises a pair of blade members, which are mounted on a pivot so as to be relatively rotatable. The blade member is provided with a blade on one end portion thereof and a grip on another end portion at the opposite sides of the pivot. A slide device that holds the part delivery tape at a relatively predetermined position on the upper surface thereof is movably mounted on the side surface of the blade of one of the blade members so as to be positioned at a first position and a second position that is a predetermined distance apart from the first position in a direction going away from the blades. Where the slide device is positioned at the first position, the carrier tape is cut off, and where at the second position, the top tape is cut off.

In cutting off the part delivery tape with the scissors, where the slide device that holds the part delivery tape is positioned at the first position, the carrier tape is cut off, and where the slide device is moved to the second position that is a predetermined distance apart from the first position in a direction going away from the blades, the top tape is cut off. Accordingly, the part delivery tape can be made with ease, wherein the top tape extends for a length equal to the slide device moving distance between the first and second positions beyond the end of carrier tape.

In the scissors for part delivery tape in the eighth invention, a clamp member is arranged to position and hold the part delivery tape on the slide device. Accordingly, the part delivery tape can be positioned and securely held on the slide device by a clamp member when the part delivery tape is cut off, whereby an operator can with ease cut off the part delivery tape.

BRIEF DESCRIPTION OF THE DRAWINGS (a) in FIG. 1 is a plan view of a part delivery tape showing the first step of the connecting process of the method of connecting part delivery tapes in the first embodiment according to the present invention; (b) in FIG. 1 is a side view;

(a) in FIG. 2 is a plan view of the part delivery tape showing the second step of the connecting process of the method of connecting the part delivery tapes in the first embodiment according to the present invention; (b) in FIG. 2 is a side view; (c) in FIG. 2 is an enlarged side view;

(a) in FIG. 3 is a plan view of the part delivery tape showing the third step of the connecting process of the method of connecting the part delivery tapes in the first embodiment according to the present invention; (b) in FIG. 3 is a side view; (c) in FIG. 3 is an enlarged side view.

PREFERRED EMBODIMENTS TO PRACTICE THE INVENTION

Figure 1:
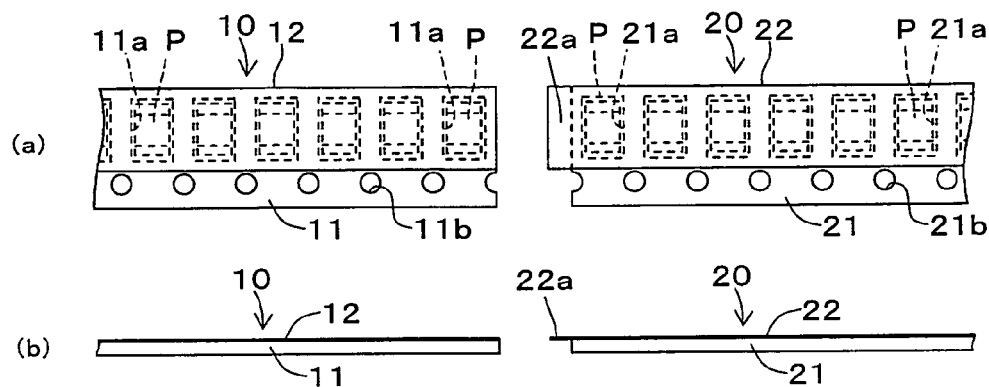
Figure 2:
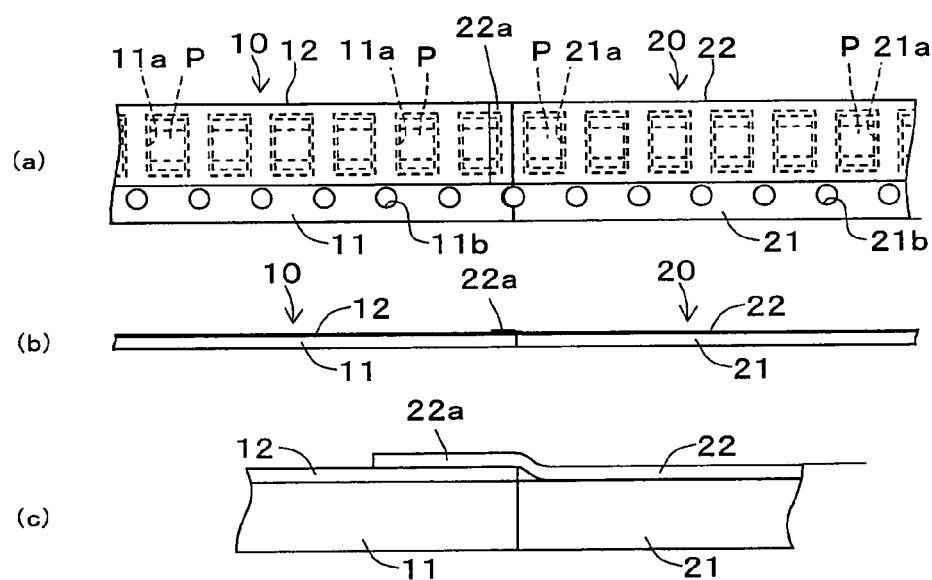
Figure 3:
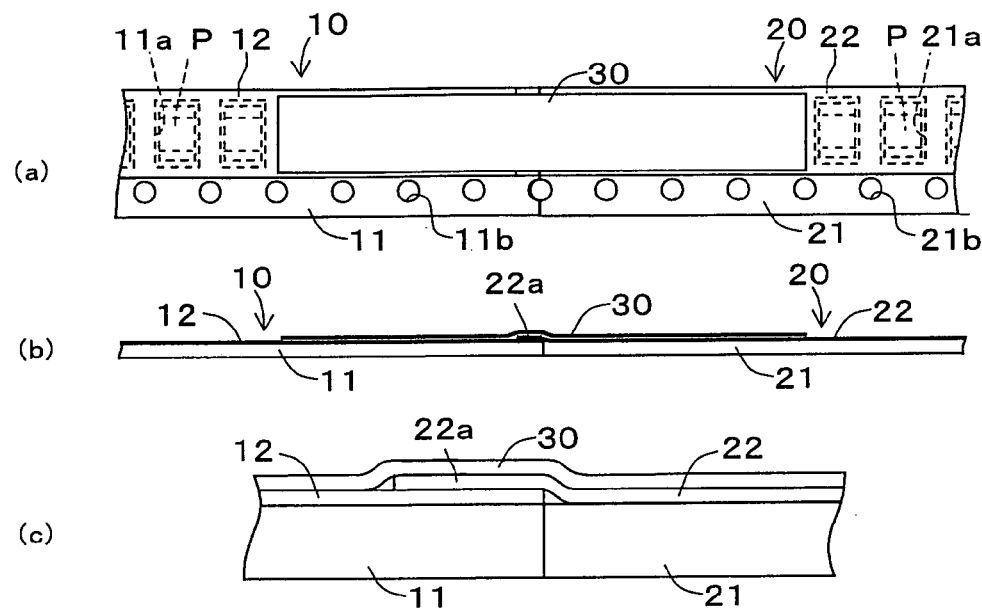

Hereafter, the method of connecting part delivery tapes in the first embodiment according to the present invention will be described. FIGS. 1 through 3 show the steps of the connecting process of the method of connecting the part delivery tapes. A part delivery tape will be explained briefly before explaining the method of connecting the part delivery tapes. The part delivery tape is wound onto a reel (not shown), which is mounted on a part supply device that composes a part mounting apparatus. The part mounting apparatus mounts parts on a circuit board successively supplied with the part delivery tape.

When the rest of the part delivery tape 10 becomes a little amount, a new part delivery tape 20 (second part delivery tape) is connected to the part delivery 10 (first part delivery tape) to continue supplying the parts. The trailing end of the first part delivery tape 10 and the leading end of the second part delivery tape 20 are shown in FIG. 1. The first part delivery tape 10 is constituted of a first long carrier tape 11 in which recess portions 11a having respective openings on the upper ends thereof for accommodating parts P are formed at predetermined intervals and the first long top tape 12 that is adhered to the upper surface of the first carrier tape 11 so as to cover the openings of the recess portions 11a. The carrier tape 11 is constituted of a paper tape in which many holes (recess portions 11a) for accommodating respective parts are made by punching, and a bottom tape that is adhered to the bottom surface of the paper tape. The carrier tape 11 is provided with feed holes along with the recess portions 11a in a longitudinal direction thereof. The ends (trailing ends) of the first carrier tape 11 and the first top tape 12 are even with each other.

As the first part delivery tape 10, the second part delivery tape is constituted of a second long carrier tape 21 in which recess portions 21a having respective openings on the upper ends thereof for accommodating parts P are formed at predetermined intervals and a second long top tape 22 that is adhered to the upper surface of the second carrier tape 21 so as to cover the openings of the recess portions 21a. The carrier tape 21 is also provided with feed holes in a row in a longitudinal direction. Both tapes 21, 22 are cut off so that the leading end of the second top tape 22 extends for a predetermined amount (for example; 2 mm) beyond the end of the leading end of the second carrier tape 21. The predetermined amount is determined with taking the difference between the adhesive strength with which the top tape adheres to the carrier tape and the adhesive strength with which the connecting tape adheres to the top tape, and the width of the top tape, etc. in consideration.

The extended end portion 22a or the leading end of the above-mentioned second top tape 22 is laid on the upper surface of the trailing end of the first top tape 12 (see FIG. 2), and a connecting tape 30 is adhered over the laid-on portion so as to connect the first and second top tapes 12,22 (see FIG. 3).

As shown in FIG. 3, the structure of connection where the first and second top tapes 12, 22 are connected with the above-mentioned method of connection is that the leading end (extended end portion 22a) of a second top tape 22 is laid on the upper surface of the trailing end of the first top tape 12, and the connecting tape 30 is adhered over the laid-on portion so as to connect the first and second top tapes 21, 22. Accordingly, in the structure the leading end (extended end portion 22a) of the second top tape 22 is inserted between the trailing end of the first top tape 12 and the connecting tape 30, thereby to connect both top tapes 12, 22 firmly. When the first and second top tapes 12, 22 that are connected with the structure of connection are torn off, the second top tape 22 is well torn off from the second carrier tape 21 because the extended end portion 22a of the second top tape 22 is put up with the trailing end of the first top tape 12 being put up, whereby the first and second top tapes 12, 22 are connected firmly so that they can be well torn off.

In the above-mentioned embodiment, it is described that the carrier tape is the so-called paper tape, however the present invention can be applied to the carrier tape made with the so-called embossed tape. In the embossed tape, the recess portions for accommodating parts are formed in the tape made of plastic.

Figure 4:
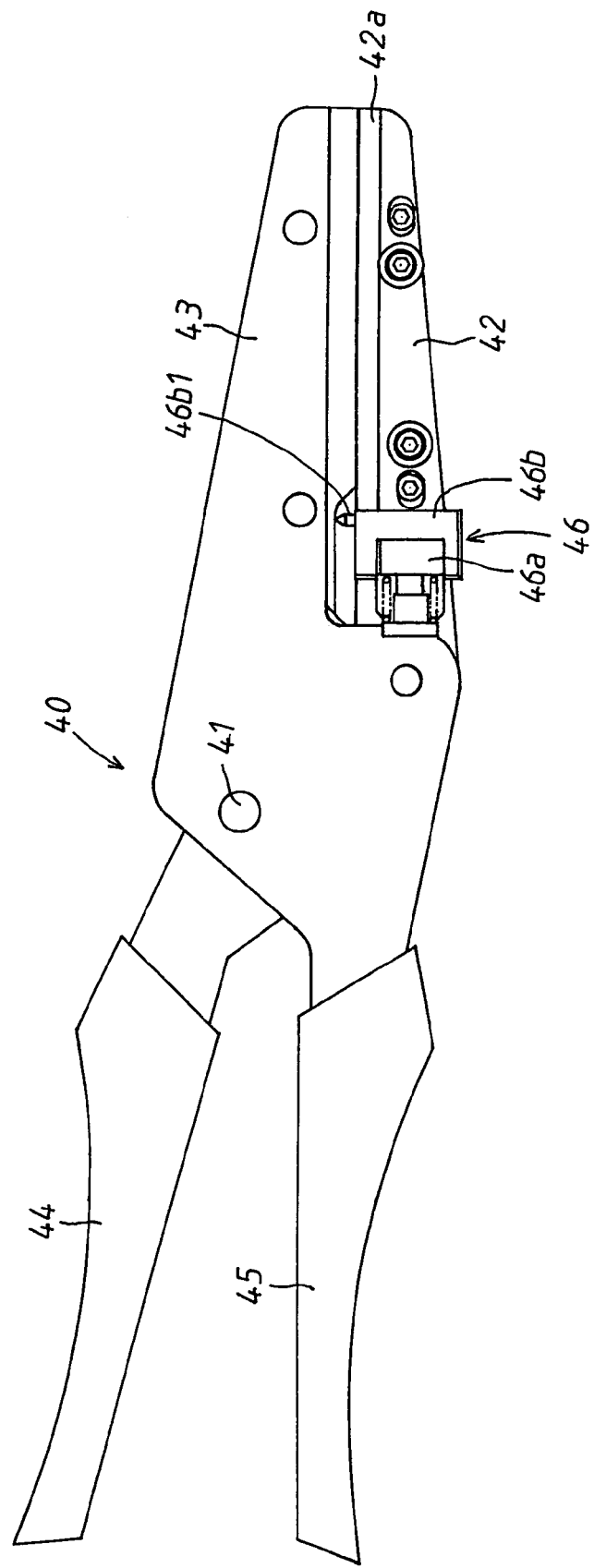
FIG. 4 is a front view of scissors for part delivery tapes in the first embodiment according to the present invention.
Figure 5:
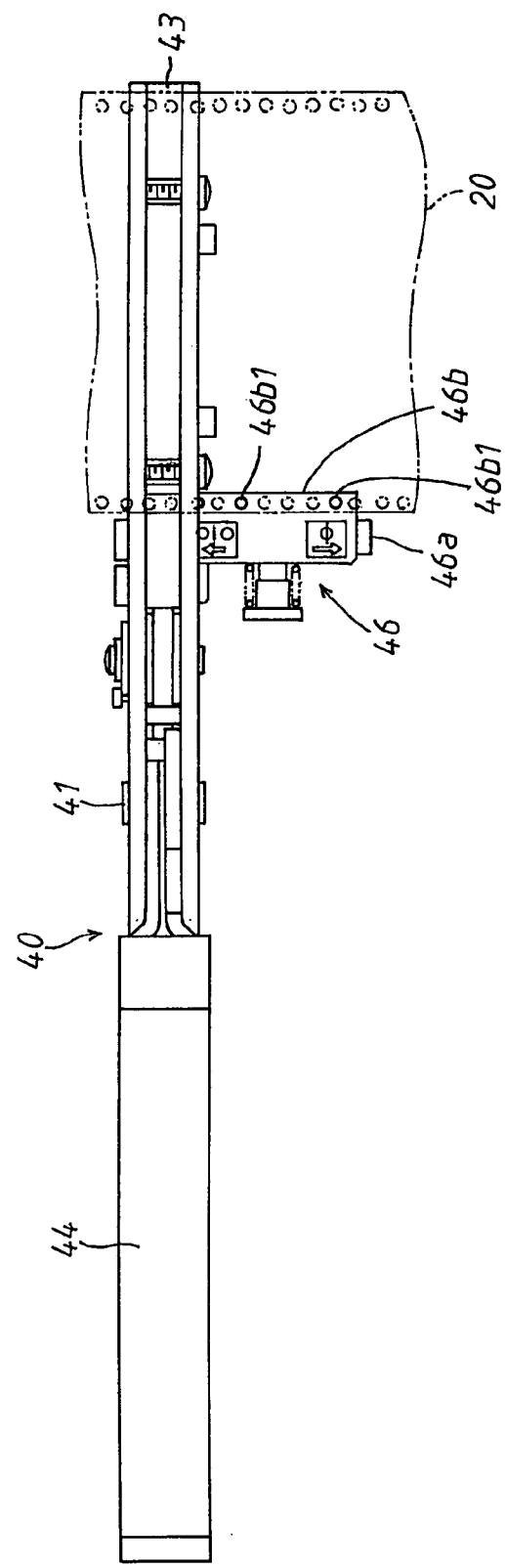
FIG. 5 is a plan view of the scissors for part delivery tapes in the first embodiment according to the present invention.

Next, the scissors for part delivery tape, which is used for the connecting method of connecting part delivery tapes in the first embodiment according to the present invention will be described with referring to FIGS. 4 through 6. The scissors 40 for part delivery tape is used to cut off the tapes 21, 22, so that the top tape 22 of the new (second) part delivery tape 20 has the extended end portion 22a that extends for a predetermined amount (for example; 2 mm) beyond the end of the carrier tape 21 as shown in FIG. 1 (a).

The scissors 40 for the part delivery tape comprises a blade member 42 and an abutment member 42, which are mounted on a pivot 41 so as to be relatively rotatable. As shown in FIG. 6, the blade member 42 is provided with the first and second blades 42a, 42b on one end portion thereof and a grip 44 on another end portion. The first and second blades 42a, 42b extend in parallel with being a predetermined distance apart. The predetermined distance is set to be equal to the length of the extended end portion 22a. The abutment member 43 is provided with an abutting portion opposite to the first and second blades 42a, 42b on one end portion thereof, and a grip 45 on another end portion. The first blade 42a is so arranged that the clearance between the first blade 42a and the opposite surface of the abutting portion is equal in thickness to the top tape 22 where the first blade 42a is at the cutting position, and the second blade 42b is arranged to abut on the opposite surface of the abutting portion where the second blade 42b is at the cutting position.

A support device 46 that supports the part delivery tape 20 on the upper surface thereof is attached on the side surface of the first blade 42a. The support device 46 is provided with a fixed member 46a that is fixed to the side surface of the first blade 42a and a support member 46b movably mounted on the fixed member 46a. On the support member 46b, plural engaging pins 46b1 that fit in the feed holes 21b of the carrier tape 21 are fixed at the intervals corresponding to the feed holes 21b, whereby the part delivery tape 20 is positioned and supported on the upper surface of the support member 46b. The part delivery tape 20 is positioned and held so that the upper surface of the top tape 22 abuts on the upper surface of the support member 46b. The support member 46b is movable in a direction (perpendicular to the paper on which FIG. 4 is drawn) where the part delivery tape 20 extends, and is selectively positioned and clamped at a first position or a second position. The position where the support member 46b is positioned is chosen between the first and second positions, so that a part accommodated in the part delivery tape 20 is not cut off by the first or the second blade 42a, 42b, (and thereby the part delivery tape 20 is cut off between the recess portions 21a neighboring each other).

Figure 6:
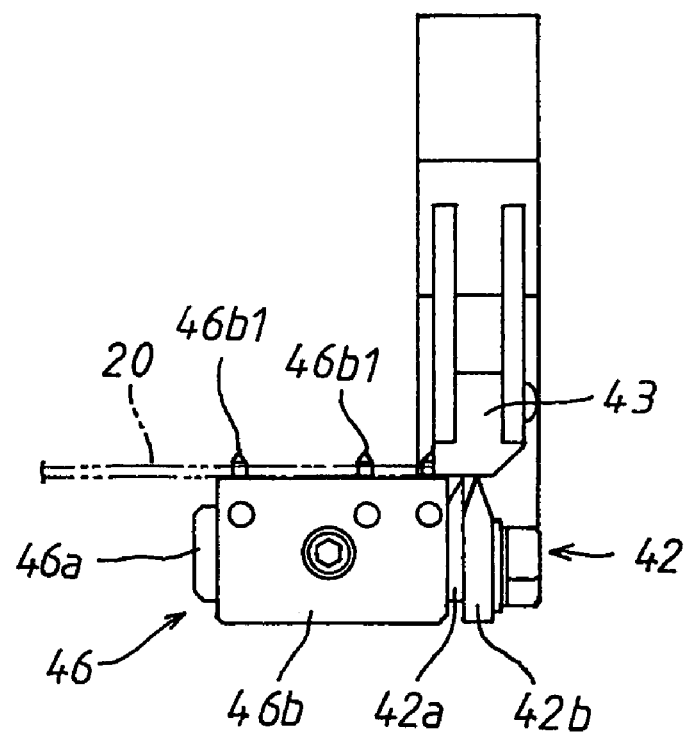
FIG. 6 is a side view of the scissors for part delivery tapes in the first embodiment according to the present invention.

As shown in FIG. 6, when the part delivery tape is cut off with the scissors, the leading end of the part delivery tape 20 is inserted from the first blade side of the scissors 40, and the feed holes 21a of the carrier tape 21 are fitted on the engaging pins 46b1 so that the part delivery tape 20 is positioned and held, wherein the upper surface of the top tape 22 contacts with the upper surface of the support member 46b. And, after the support member 46b is positioned and clamped at the first or the second position, the grips 44, 45 are moved close to each other to cut off the part delivery tape 20 with the blade member 42 and the abutment member 43. The carrier tape 21 of the part delivery tape 20 is cut off by being pinched between the first blade 42a of the blade member 42 and the abutting portion of the abutment member 43, and at the same time the carrier tape 21 and the top tape 22 of the part delivery tape 20 are cut off by being pinched between the second blade 42b and the abutting portion. Accordingly, the part delivery tape 20 can be made with ease, wherein the top tape 22 extends for a length equal to the distance between the first and second blades 42a, 42b beyond the end of the carrier tape 21. An operator can easily cut off the part delivery tape 20, because the part delivery tape is supported on the support member 46 when the part delivery tape 20 is cut off.

Figure 7:
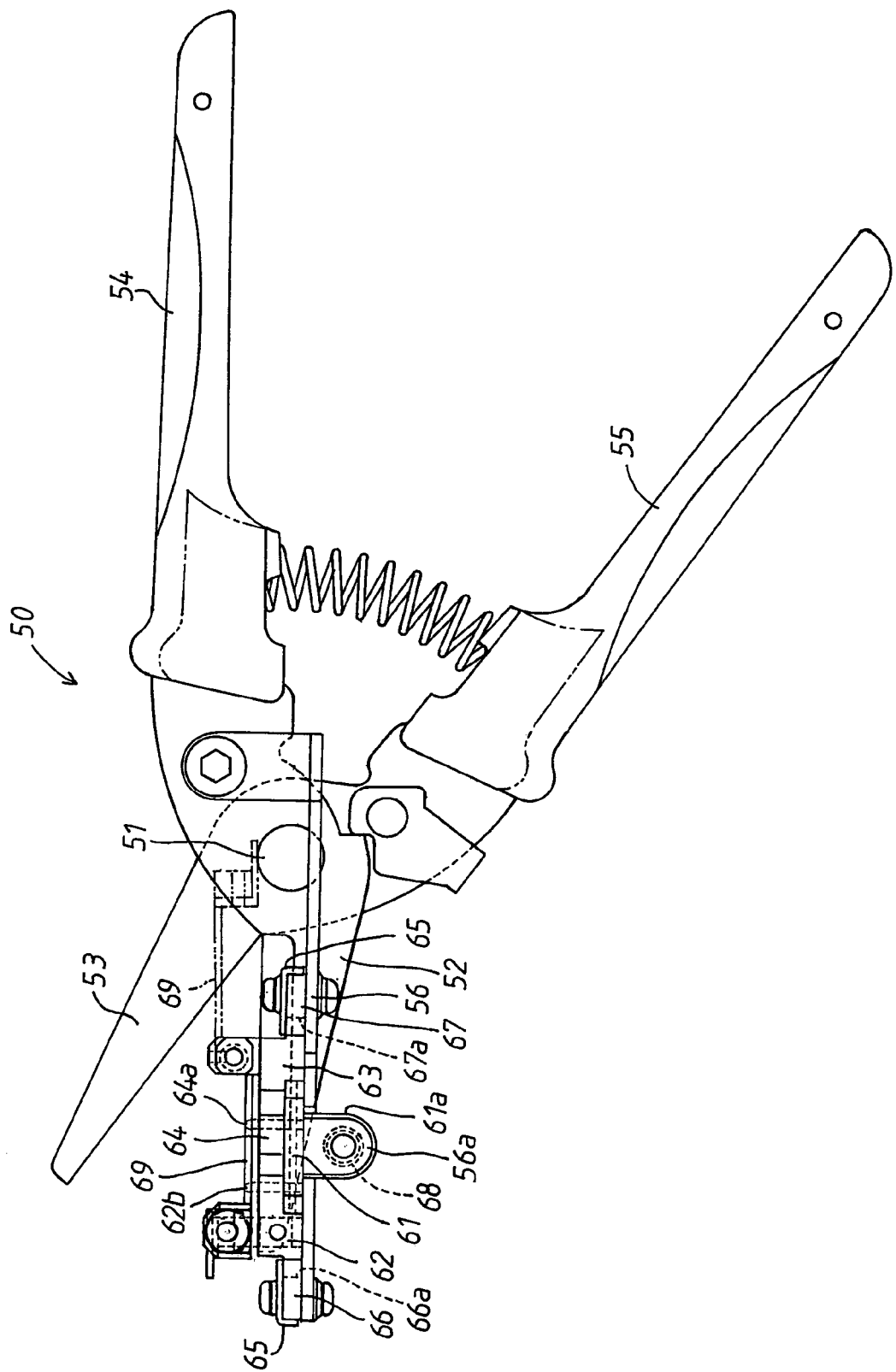
FIG. 7 is a front view of scissors for part delivery tapes in the second embodiment according to the present invention.
Figure 8:
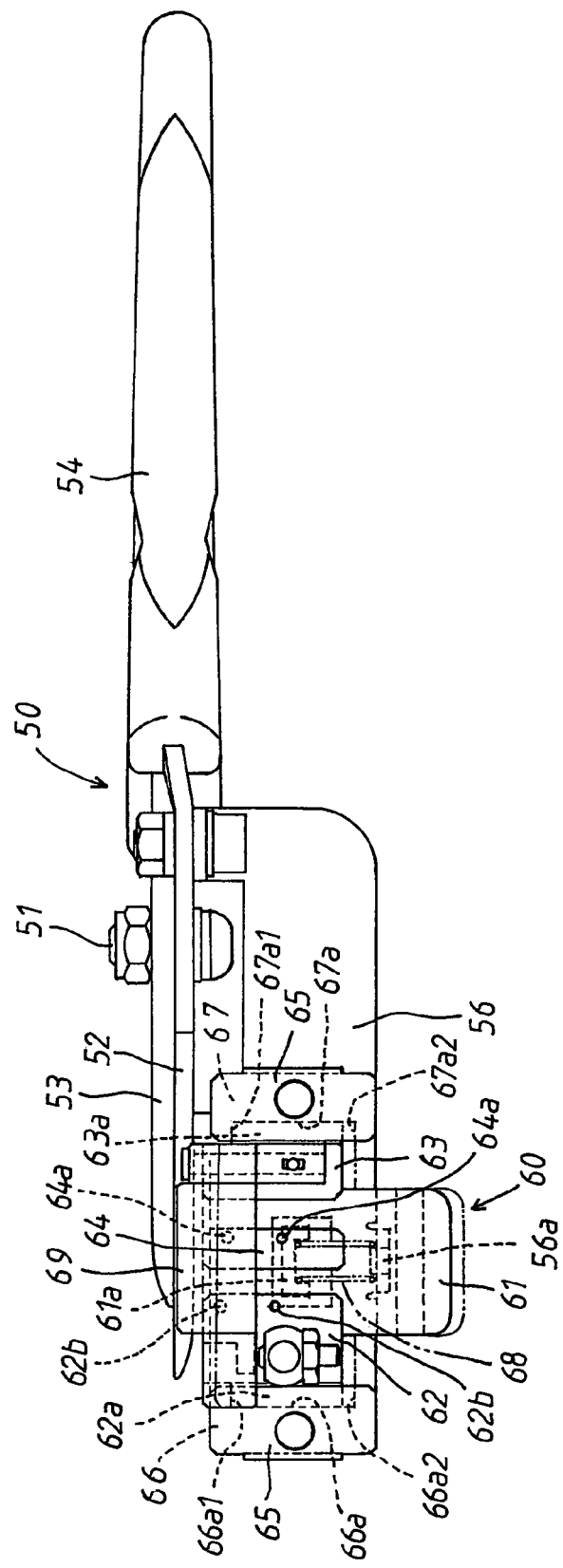
FIG. 8 is a plan view of the scissors for part delivery tapes in the second embodiment according to the present invention.

The scissors for part delivery tape, which is used for the connecting method of connecting part delivery tapes in the second embodiment according to the present invention will be described with referring to FIGS. 7 and 8. The scissors 50 for the part delivery tape is also used to cut off tapes 21, 22, as the scissors 40, so that the top tape 22 has the extended end portion 22a that extends for a predetermined amount (for example; 2 mm) beyond the carrier tape 21 as shown in FIG. 1 (a).

The scissors 50 for the part delivery tape comprises a pair of blade members which are mounted on a pivot 51 so as to be relatively rotatable. The blade members are provided with respective blades 52, 53 on one end portion and respective grips 54, 55 on another end portion. On the side surface of the blade 52, a bracket 56 is attached, with on end thereof being screwed to the blade 52 and another end being welded thereto. A slide device 60 is mounted on the bracket 56. The slide device 60 comprises body 61, front and rear sliders 62, 63 secured to the body 61, and a support member 64 that is fixedly mounted on the upper surface of the body 61 between the front and the rear sliders 62, 63. As shown in FIG. 8, the front end 62a of the front slider 62 and the rear end 63a of the rear slider 63 are guided by respective retracted portions 66a, 67a of a front and rear guide members 66, 67 that are fixed to the bracket 56 with respective fixtures 65, 66, so that the front and rear sliders 62, 63 are slidable rightward and leftward (upward and downward in FIG. 8), and thereby the slide device 60 is slidable rightward and leftward.

A projecting portion 61a that extends downward is formed on the lower surface of the body 61. The body 61 is resiliently urged toward the blades 52, 53 by the spring 68 that is interposed between the projecting portion 61a and a projecting block 56a fixed to the bracket 56, so that the front end 62a of the front slider 62 and the rear end 63a of the rear slider 63 abut on the right-hand inner surface 66a1, 67a1 of the retracted portion 66a, 67a of the front and rear guide members 66, 67. Thereby, the slide device 60 is positioned and held at the first position as drawn with a solid line in FIG. 8. When an operator shifts the slide device 60 leftward (downward in FIG. 8) against the resilient force of the spring 68, the front end 62a of the front slider 62 and the rear end 63a of the rear slider 63 abut on the left-hand inner surface 66a2, 67a2 of the retracted portion 66a, 67a of the front and rear guide members 66, 67, so that the slide device 60 is positioned and held at the second position as drawn with a two-dot chain line in FIG. 8. The distance between the first and second positions is set to be equal to the length of the extended end portion 22a.

The upper surfaces of the front slider 62 and support member 64 are arranged to be the same in height as the edge of the blade 52.

The slide device 60 is provided with two engaging pins 62b that are fixedly set up on the upper surface of the front slider 62 to fit in the feed holes 21b formed in the carrier tape 21, and two engaging pins 64a that are set up on the upper surface of the support member 64 to fit in the feed holes 21b formed in the carrier tape 21, and thereby the part delivery tape 20 is positioned and held on the upper surface of the slide device 60. One pair of engaging pins 62b and another pair of engaging pins 64a are disposed in parallel directions at the same interval, but two pairs of engaging pins are located at a little different positions in the longitudinal direction of the part delivery tape 20. In the standards of producing the part delivery tapes 20, the interval of the feed holes 21b are identical even if the sizes of the parts P accommodated in the part delivery tape 20 are different (or sizes and intervals of the recess potions are different), and therefore the positional relations between the feed holes 21b and recess portions 21a can be different in dependence on the kinds of the part delivery tapes 20. Accordingly, the feed holes 21b of the carrier tape 21 are selectively fitted on the engaging pins 62b or 64a in dependence on the kinds of the part delivery tape 20, so that a part P accommodated in the part delivery tape 20 is not cut off by the blades 52, 53, (whereby the part delivery tape 20 is cut off between the recess portions 21a neighboring each other). On the upper portion of the rear slider 63 of the slide device 60, a clamp member 69 is rotatably mounted, so that the part delivery tape 20 that is positioned and held on the upper surface of the slide device 60 is pressed from the upper side thereof by the clamp member 69, thereby to be securely held.

When the part delivery tape is cut off with the scissors for part delivery tape, the part delivery tape 20 is inserted from the left side of the scissors 50, where the slide device 60 is mounted on the blade 52. The clamp member 69 is opened, and the part delivery tape 20 is laid on the upper surface of the slide device 60 with the carrier tape 21 being under-side, wherein the feed holes 21b of the carrier tape 21 are selectively fitted on the engaging pins 62b or 64a in dependence on the kinds of the part delivery tape 20. Then, the clamp member 69 is closed, so that the part delivery tape 20 is positioned and securely held on the slide device 60. Thereafter, the top tape 22 is torn off, and pulled in the direction opposite to the blades 52, 53 (leftward of the scissors 50), and then the grips 54, 55 are moved close to each other to cut off only the carrier tape 21. The top tape 22 is pulled leftward, thereby to be returned to the position where it extends rightward of the scissors 50. And, the slide device 60 is moved to be positioned and held at the second position, wherein the grips 54, 55 are moved close to each other to cut off only the top tape 21. Accordingly, the part delivery tape 20 can be made with ease, wherein the top tape 22 extends beyond the end of the carrier tape 21 for a length equal to the distance that the slide device 60 moves between the first and second positions. An operator can easily cut off the part delivery tape 20, because the part delivery tape 20 can be securely held on the slide device 60 by the clamp member 69 when the part delivery tape 20 is cut off.

INDUSTRIAL APPLICABILITY

As mentioned above, the method of connecting the part delivery tapes, the structure of the connection, and the scissors for part delivery tape, used for the connecting method according to the present invention can be wide used in connecting the two part delivery tapes with adhering the connecting tape over the end portions of the two part delivery tapes.

The invention claimed is:

1. Scissors for cutting off a part delivery tape; said part delivery tape including a carrier tape including recess portions at predetermined intervals, said recess portions including openings on an upper end thereof for accommodating parts, and a top tape adhered to the upper surface of the carrier tape so as to cover the openings of the recess portions, said scissors comprising:

a blade member rotatably mounted on a pivot;

an abutment member rotatably mounted on the pivot;

the blade member including first and second blades on one end portion thereof and a grip on another end portion, said blades and said grip at opposite sides of the pivot, the abutment member including an abutting portion on one end portion thereof and a grip on another end portion at opposite sides of the pivot, wherein the first and second blades extend in parallel to one another and are a predetermined distance apart, wherein the first blade is arranged so that a clearance between the first blade and an opposite surface of the abutting portion is equal in thickness to the top tape where the first blade is at a cutting position; and wherein the second blade is arranged to abut on the opposite surface of the abutting portion where the second blade is at a cutting position.

2. The scissors for part delivery tape as set forth in claim 1, wherein the scissors are configured so that the part delivery tape can be inserted from the first blade side of the scissors.

3. The scissors for part delivery tape as set forth in claim 1, wherein the first blade of the blade member has a side surface and a support device for supporting the part delivery tape on the side surface.

4. Scissors for cutting off a part delivery tape; said part delivery tape including a carrier tape, said carrier tape including recess portions at predetermined intervals including openings on upper ends thereof for accommodating parts, and a top tape adhered to the upper surface of the carrier tape so as to cover the openings of the recess portions, said scissors comprising:

first and second blade members rotatably mounted on a pivot, each blade member including first and second end portions;

each blade member including a blade on one end portion thereof and a grip on another end portion, said blades and said grips at opposite sides of the pivot; and a slide device that holds the part delivery tape on an upper surface thereof movably mounted on a side surface of the blade of the first blade member so as to be positioned at first and second positions that are a predetermined distance apart from each other, wherein the blades are configured to cut off the carrier tape where the slide device is positioned at the first position, and the blades are configured to cut off the top tape where the slide device is positioned at the second position.

5. The scissors for part delivery tape as set forth in claim 4, further comprising a clamp member arranged to position and securely hold the part delivery tape on the slide device.

* * * * *